United States Patent [19]

Ohkase et al.

[11] Patent Number: 4,955,775
[45] Date of Patent: Sep. 11, 1990

[54] SEMICONDUCTOR WAFER TREATING APPARATUS

[75] Inventors: Wataru Ohkase, Sagamihara; Seishiro Sato, Machida, both of Japan

[73] Assignee: Tel Sagami Limited, Kanagawa, Japan

[21] Appl. No.: 281,756

[22] Filed: Dec. 9, 1988

[30] Foreign Application Priority Data

Dec. 12, 1987 [JP] Japan ................................ 62-314925

[51] Int. Cl.[5] ............................................... F27D 3/00
[52] U.S. Cl. .................................... 414/152; 414/172; 414/222; 414/416; 432/239
[58] Field of Search ............... 414/150, 152, 156, 153, 414/160, 172, 198, 222, 225, 331, 403, 404, 416, 417, 778, 783, 936, 937, 938, 939, 940, 941; 432/239

[56] References Cited

U.S. PATENT DOCUMENTS

| | | | |
|---|---|---|---|
| 4,662,811 | 5/1987 | Hayden | 414/786 X |
| 4,669,938 | 6/1987 | Hayward | 414/156 |
| 4,695,706 | 9/1987 | Mizushina | 414/172 X |
| 4,744,715 | 5/1988 | Kawabata | 414/331 |
| 4,765,793 | 8/1988 | Goddeau | 414/222 X |
| 4,770,590 | 9/1988 | Hughes et al. | 414/172 |
| 4,778,382 | 10/1988 | Sakashita | 414/156 X |
| 4,840,530 | 6/1989 | Nguyen | 414/404 |

FOREIGN PATENT DOCUMENTS 0258459 12/1985 Japan .

Primary Examiner—David A. Bucci
Assistant Examiner—John V. Bosche
Attorney, Agent, or Firm—Oblon, Spivak, McClelland, Maier & Neustadt

[57] ABSTRACT

An apparatus is disclosed which can automatically load semiconductor wafers into a vertical type heat treatment furnace and unload treated semiconductor wafers out of the heat treatment furnace. The semiconductor wafer treating apparatus comprises exchange unit for exchanging the semiconductor wafers between the cassette and the wafer boat in a predetermined exchange position, transfer unit for allowing the wafer-held boat to be transported between the exchange position and a respective, vertical type heat treatment furnace and for allowing the transfer of the wafer boat to be effected between the transfer unit and the respective heat treatment furnace, and an elevator unit provided in the heat treatment furnace and adapted to receive the wafer boat from the transfer unit and to load the wafer boat into a vertically erect process tube and unload the wafer boat from the process tube.

5 Claims, 3 Drawing Sheets

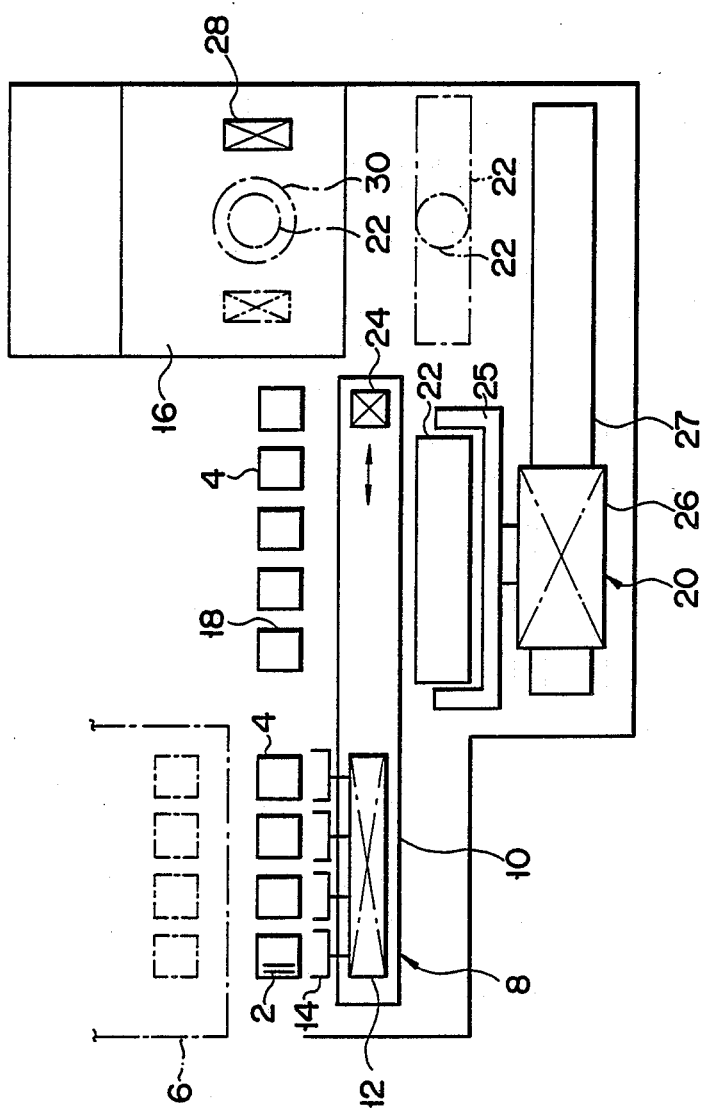
F I G. 1

SEMICONDUCTOR WAFER TREATING APPARATUS

BACKGROUND OF THE INVENTION

1. Field of the Invention

The present invention relates to a semiconductor wafer treating apparatus and, more in particular, a semiconductor wafer treating apparatus for transferring semiconductor wafers which are stored within a cassette to a vertical type heat treatment furnace and transferring semiconductor wafers which are treated within the heat treatment furnace to the interior of the cassette.

2. Description of the Related Art

In the manufacture of semiconductor devices such as ICs, wafers are subjected to a greater number of heat treatment steps, such as an impurity diffusion, thermal oxidation, CVD (chemical vapor deposition) step, etc., in which case a heat treatment furnace is employed. A plurality of semiconductor wafers to be heat treated are arranged erect on a wafer boat made of quartz and then loaded into the heat treatment furnace.

As set out above, it is necessary to conduct various steps for the heat treatment of semiconductor wafers, such as a step for arranging semiconductor wafers which are stored in the cassette onto a wafer boat in an "erect" fashion, a step for loading the semiconductor wafers which are arranged erect on the wafer boat into the heat treatment furnace and unloading treated wafers out of the heat treatment furnace and a step for storing the treated wafers from the wafer boat into the cassette. In order to perform these steps automatically, use is made of a wafer treating apparatus for automatically transferring semiconductor wafers.

Conventionally use has been made, as a heat treatment furnace, of a lateral type as opposed to a vertical type heat treatment furnace. Recently the vertical type heat treatment furnace has been employed, mainly because it can save a considerable amount of installation area in a clean room compared with the lateral type heat treatment furnace. Further, the vertical type heat treatment furnace provides a following additional advantage. In the case where the lateral type furnace is used, the wafer boat is likely to contact the inner wall of the process tube in the furnace when it is introduced into the process tube. Therefore, precise control is required for attaining soft-landing in which the wafer boat is introduced into the process tube while being kept separate from the inner wall. However, in the case where the vertical type heat treatment furnace is used, the soft-landing can be easily attained by merely elevating the wafer boat within the vertical process tube.

In the vertical type furnace, semiconductor wafers to be treated are loaded into the furnace, while being transferred in a vertical as opposed to a horizontal direction. To this end, a different wafer transfer apparatus is required upon comparison with the transverse furnace.

In the case of the vertical type furnace, there is a tendency for a plurality of such furnaces to be employed in a single manufacturing line in view of the merits of the vertical type furnace, such as the smaller installation area required. Effective equipment is, therefore, required to allow the to-be-treated semiconductor wafers to be effectively transferred to and from the plurality of vertical type furnaces.

SUMMARY OF THE INVENTION

It is accordingly the object of the present invention to provide a semiconductor wafer treating apparatus which can effectively transfer semiconductor wafers to and from one or a plurality of vertical type heat treatment furnaces.

In order to achieve the aforementioned object, a semiconductor wafer treating apparatus is provided which comprises exchange means for allowing the exchange of the semiconductor wafers between the wafer container and the wafer vessel for heat treatment, in a predetermined exchange position; transfer means for allowing the wafer vessel which holds the semiconductor wafers thereon to be transported between the exchange position and an installation position of at least one, vertical type heat treatment furnace and the wafer vessel which holds the semiconductor wafers thereon to be transferred between the transfer means and the heat treatment furnace; and elevator means provided in the heat treatment furnace and adapted to receive the wafer vessel from the transfer means and to load the wafer vessel into a vertically erect process tube, and unload it out of the process tube.

BRIEF DESCRIPTION OF THE DRAWINGS

FIG. 1 is a plan view showing a semiconductor wafer treating apparatus according to one embodiment of the present invention;

DETAILED DESCRIPTION OF THE PREFERRED EMBODIMENTS

Figure 2:
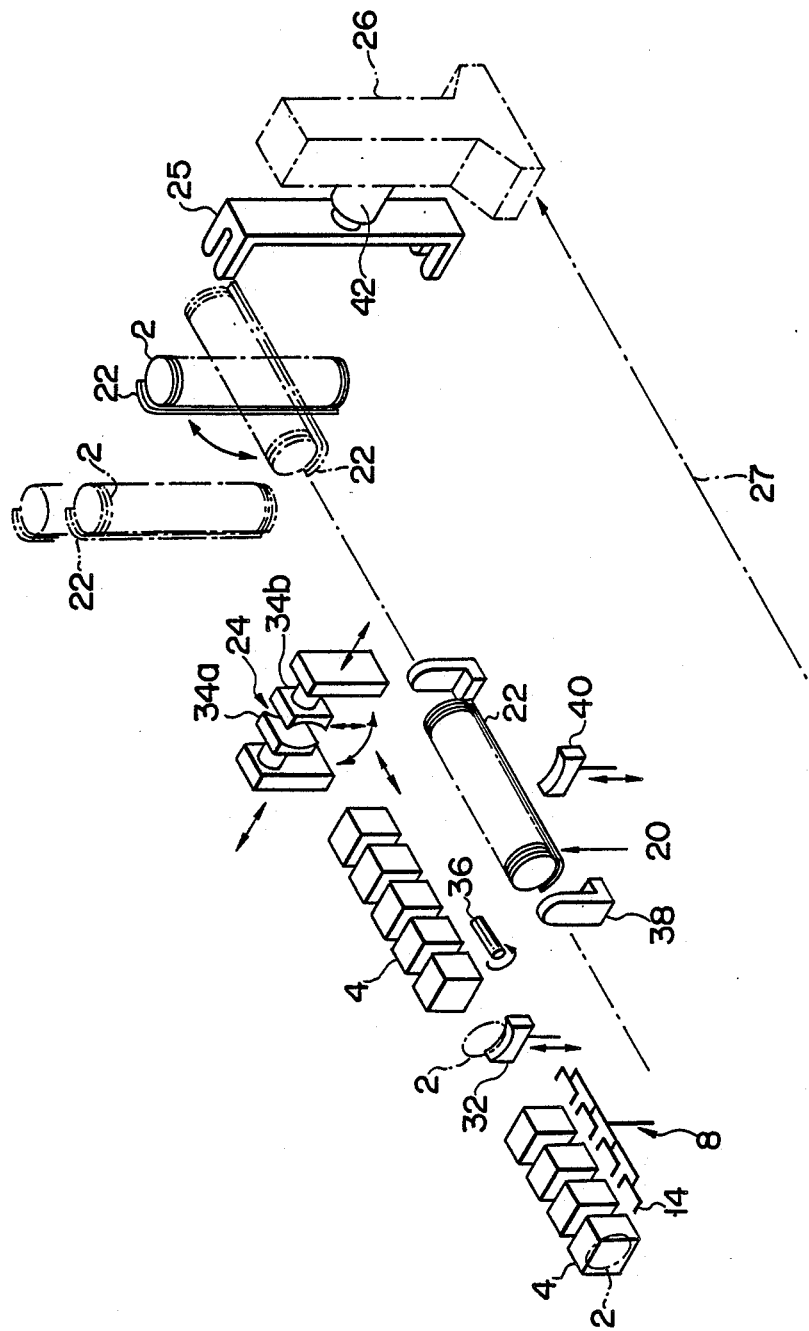
FIG. 2 is an explanatory view showing a transfer mechanism in the semiconductor wafer transfer apparatus of FIG. 1.

FIG. 1 is a plan view showing a semiconductor wafer treating apparatus according to one embodiment of the present invention. In the embodiment shown in FIG. 1, semiconductor wafers 2 are held within respective cassette 4 in units of a predetermined amount. Cassettes 4 for holding wafers 2 in place are stored in stocker 6.

Process tube 30 is vertically arranged within a vertical type heat treatment furnace 16 for conducting a treatment such as impurity diffusion, oxidation, heating, CVD and so on. At the bottom of process tube 30 is provided an access opening which allows the wafer to be loaded into and out of the process tube. Elevator mechanism 28 is located within heat treatment furnace 16 to allow wafers 2 to be transferred in a perpendicular plane.

The wafer transfer apparatus in the present embodiment includes first transfer mechanism 8 and second transfer mechanism 20 to allow wafers 2 to be transferred between stocker 6 and heat treatment furnace 16. First transfer mechanism 8 includes first track 10 extending from a position of stocker 6 toward that of heat treatment furnace 16 and carriage 12 which is slidably movable on track 10. Carriage 12 transfers cassettes 4 between itself and stocker 6 and travels on track 10. To this end, four cassette holders 14 are mounted in carriage 12 to hold the corresponding cassettes. Wait area 18 is created near that portion of track 10, situated on the side of the heat treatment furnace, to allow the cassettes to wait their turn. Exchange mechanism 24 is provided between cassette 4 in the wait area and second transfer mechanism 20 and mounted such that it is slidably movable on track 10.

Second transfer mechanism 20 includes second track 27 extending from a position of wait area 18 to the front area of heat treatment furnace 16 and carriage 26 which is so mounted as to be movable on track 27. Second transfer mechanism 20 also includes wafer boat 22 which takes the semiconductor wafer from exchange mechanism 24 and holds it. A ball screw is mounted relative to track 27 and, upon the rotation of the ball screw, carriage 26 can travel over a distance from the position of wait area 18 to the front of heat treatment furnace 16. Handler 25 is attached to carriage 26 to hold wafer boat 22. Wafer boat 22 is transported by carriage 26 on track 27.

At the location of heat treatment furnace 16, wafer boat 22 is transferred between handler 25 and elevator mechanism 28. Wafer boat 22, upon being lifted upwards or downwards by elevator 28 within the heat treatment furnace, is moved in a vertically erect fashion. On the other hand, when wafer boat 22 is conveyed on track 27, it does so in a horizontal fashion. As will be appreciated from the above, the "hand-over" operation of wafer boat 22 between handler 25 and elevator mechanism 28 includes a "90°-turn" of wafer boat 22. Orienting mechanism 42 is attached to handler 25 to perform the aforementioned operation.

FIG. 2 is a perspective view showing the mechanism of the apparatus according to the embodiment of the present invention. The operation of the aforementioned transfer apparatus will be explained below with reference to FIG. 2.

Four cassettes 4 which hold a predetermined number of semiconductor wafers 2 therein are taken out from stocker 6 and held in place by cassette holder 14. Carriage 12 runs on track 10 to transport cassettes to wait area 18 where semiconductor wafers 2 are handled, by exchange mechanism 24, over to second transfer mechanism 20 as set forth below. Exchange mechanism 24 is constructed of push-up device 32 and a pair of arms 34a, 34b which can be opened and closed by a drive means, such as a pneumatic driver or an electric driver.

The cassette is opened at its top and bottom with semiconductor wafers 2 engaged on the side walls of the cassette. As shown in FIG. 2, push-up mechanism 32 is placed at wait area 18 and adapted to push up semiconductor wafers 2, piece by piece or every 25 pieces collectively, from the open bottom side to allow the emerging semiconductor wafer to be gripped by grip arms 34a and 34b. In this way, the emerging wafers are arranged erect on the boat. In order to conduct the aforementioned exchange operation, grip arms 34a, 34b can be moved in the directions indicated by arrows.

Since an orientation flat (cutout) is provided on semiconductor wafer 2, it is necessary to orient semiconductor wafers 2 within cassette 4 so that the aforementioned exchange may be conducted. To this end, rotation roller 36 is provided on wait area 18 for wafer orientation, because some wafers are held on the cassette with their orientation flat down and the other wafers with the other area emerging from the open bottom of cassette 4. By rotating roller 36 at the bottom of cassette 4, said other wafers are rotated to a position where their orientation flat comes to the bottom of cassette 4. As a result, semiconductor wafers 2 on the cassette are all oriented so as to be flat down.

In the aforementioned exchange operation, wafer boat 22 which receives semiconductor wafers 2 is held by holding mechanism 38 which is placed between first transfer mechanism 8 and second transfer mechanism 20. Then handler 25 receives wafer boat 22 from holding mechanism 38, completing the exchange operation from first transfer mechanism 8 to second transfer mechanism 20. In this connection it is to be noted that the exchange operation of semiconductor wafers 2 can be achieved with wafer boat 22 held by handler 25 in which case holding mechanism 38 is not necessary.

Carriage 26 is then transported on track 27, carrying wafer boat 22 to the front of heat treatment furnace 16 where orienting mechanism 42 is operated to allow handler 25 to be turned within a vertical field. When this is done, wafer boat 22 is turned as indicated by arrows in FIG. 2 to orient it in the vertical direction. Then wafer boat 22 is handed from handler 25 to elevator mechanism 28 in heat treatment furnace 16 in a vertically oriented relation. Wafer boat 22 is guided by elevator mechanism 28 into process tube 30 via the access opening which is provided at the bottom of process tube 30. Then the wafer boat is lifted, placing it to a predetermined heat treatment position where semiconductor wafers 22 which are held within process tube 30 and are subjected to predetermined heat treatment steps, such as an impurity diffusion step.

After the completion of the heat treatment step, "treated" wafers 2 are transported, in a reverse route, back to the front position of stocker 6 where they are stored. First, wafer boat 22 is unloaded, by elevator mechanism 28, out of the process tube and passed to handler 25. Then wafer boat 22 is transferred to the wafer exchange position after it has been turned in the horizontal direction. At that position, second push-up mechanism 40 is provided whereby erect wafers 2 on wafer boat 22 are pushed up, piece by piece or every 25 pieces collectively. The pushed-up wafer 2 is gripped by arms 34a, 34b and stored in cassette 4 at wait area 18. Thus all the wafers which are arranged erect on wafer boat 22 are stored within four cassettes. The cassette carrying "treated" wafers thereon is transported on a first track and stored in stocker 6.

As set out above, according to the present invention, those semiconductor wafers 2 kept within each respective cassette can be transported so that they each automatically be loaded into process tube 30 within vertical type heat treatment furnace 16. It is thus possible to automatically take the treated wafers out of process tube 30 and to store them into stocker 6.

Figure 3:
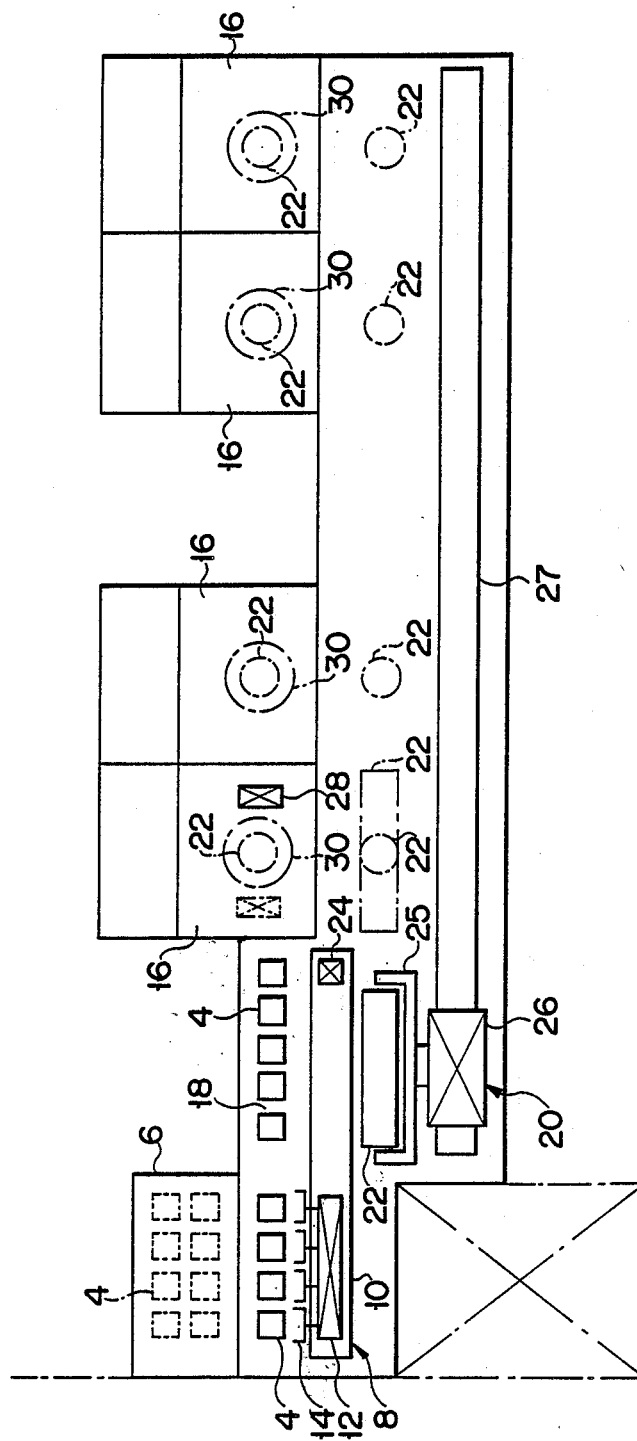
FIG. 3 is a plan view showing a semiconductor wafer transfer apparatus according to another embodiment of the present invention.

Although the present invention has been explained as being applied to a manufacturing line including a single heat treatment furnace as set forth above, it may also apply to a manufacturing line including a plurality of heat treatment furnaces as shown in FIG. 3. The embodiment of FIG. 3 is substantially the same as the preceding embodiment except that, as shown in FIG. 3, four vertical type heat treatment furnaces 16 are installed along the manufacturing line and track 27 of second transfer mechanism 20 can pass in front of respective heat treatment furnaces 16. The embodiment of FIG. 3 allows the transfer of semiconductor wafers 2 to each respective heat treatment furnace in the same fashion as set out above. As will be seen from the above, the present invention has a greater advantage as set out above since it can be applied to the manufacturing line along which a plurality of longitudinal type heat treatment furnaces have been installed.

What is claimed is:

1. A semiconductor wafer treating apparatus comprising:

exchange means for allowing an exchange of the semiconductor wafers between a wafer container and a wafer vessel for heat treatment, in a predetermined exchange position, said wafers being held in a vertical orientation during the exchange, in the wafer container, and on the vessel located in the exchange position;

a plurality of vertical-type heat treatment furnaces;

transfer means for allowing the wafer vessel which holds the semiconductor wafers thereon to be conveyed between the exchange position and each of the vertical type heat treatment furnaces, and for allowing transfer of the wafer vessel between the transfer means and the heat treatment furnaces, the wafer vessel being transferred while held in a vertical orientation; and elevator means provided within the each heat treatment furnace to take the wafer vessel from the transfer means and load the vessel into a vertically oriented process tube and unload the vessel out of the process tube;

wherein said transfer means comprises a track extending from said exchange position to an installation position of said heat treatment furnace, a carriage placed on the track to be movable along the track, and a handler mounted on said carriage to allow holding and handling of said wafer vessel;

wherein said handler includes orientation means for orienting the direction of said wafer vessel, the transfer of said vessel between the handler and said elevator means being performed with said wafer vessel held in a vertical orientation and the conveyance of the wafer vessel on said track being effected with the wafer vessel held in a horizontal orientation; and wherein said orientation means orients said wafer vessel in vertical and horizontal directions by rotating said wafer vessel around its center.

2. A semiconductor wafer treating apparatus according to claim 1, wherein said exchange means comprises push-up means for allowing said semiconductor wafers which are held in said wafer container or on said wafer vessel located in said exchange position, to be pushed up from below, and exchange arms adapted to grip the semiconductor wafer emerging upon the pushing of the push-up means to allow a wafer exchange.

3. A semiconductor wafer treating apparatus according to claim 1, further comprising vessel holding means located between said first and second transfer means to hold said wafer vessel during said exchange operation.

4. A semiconductor wafer treating apparatus according to claim 1, further comprising means provided at said exchange position to orient the direction of said semiconductor wafers which are held in said wafer container.

5. A semiconductor wafer treating apparatus comprising:

exchange means for allowing an exchange of the semiconductor wafers between a wafer container and a wafer vessel for heat treatment, in a predetermined exchange position;

a plurality of vertical type heat treatment furnaces;

transfer means for allowing the wafer vessel which holds the semiconductor wafers thereon to be conveyed between said exchange position and each of said vertical type heat treatment furnaces, and for allowing transfer of the vessel between the transfer means and the heat treatment furnaces, said wafer vessel being transferred while held in a vertical orientation;

a handler mounted on said transfer means for allowing said wafer vessel to be oriented in vertical and horizontal directions, by rotating said wafer vessel around its center; and elevator means provided within each heat treatment furnace to take the wafer vessel from the transfer means and load the vessel into a vertically oriented process tube and unload the vessel out of the process tube.

* * * * *